United States Patent [19]
Adams et al.

[11] Patent Number: 5,784,323
[45] Date of Patent: Jul. 21, 1998

[54] TEST CONVERAGE OF EMBEDDED MEMORIES ON SEMICONDUCTOR SUBSTRATES

[75] Inventors: Robert Dean Adams, Essex Junction; John Connor, Burlington; Garrett Stephen Koch, Cambridge; Luigi Ternullo, Jr., Golchester, all of Vt.

[73] Assignee: International Business Machines Corporation, Armonk, N.Y.

[21] Appl. No.: 795,367

[22] Filed: Feb. 4, 1997

Related U.S. Application Data

[63] Continuation of Ser. No. 450,431, May 25, 1995, abandoned.
[51] Int. Cl.$^6$ .................................................. G11C 29/00
[52] U.S. Cl. ............................................. 365/201; 371/21.2
[58] Field of Search ......................... 365/189.04, 189.05, 365/189.07, 201, 238.5; 371/21.2, 21.5, 24, 25.5

[56] References Cited

U.S. PATENT DOCUMENTS

| | | | |
|---|---|---|---|
| 4,049,956 | 9/1977 | Van Veen | 235/153 |
| 4,701,920 | 10/1987 | Resnick | 371/25 |
| 5,077,690 | 12/1991 | Smith | 365/201 |
| 5,138,619 | 8/1992 | Fusang | 371/21.1 |
| 5,173,906 | 12/1992 | Dreibelbis | 371/22.5 |
| 5,258,986 | 11/1993 | Zerbe | 365/201 |
| 5,341,341 | 8/1994 | Fukuzo | 365/189.05 |
| 5,463,585 | 10/1995 | Sanada | 365/201 |
| 5,473,577 | 12/1995 | Miyake | 365/189.04 |

FOREIGN PATENT DOCUMENTS

A-4143611  6/1993  Germany.

*Primary Examiner*—A. Zarabian
*Attorney, Agent, or Firm*—Calfee, Halter & Griswold LLP

[57] ABSTRACT

The present invention provides a device for testing memory having write cycles and read cycles. A BIST state machine changes the data applied to the memory's DI port during read cycles to a value different from that of the data stored in the currently addressed memory location. The BIST-generated expect data also is at a different value from that of data at the memory's DI port and at the same value as the data stored at the current memory address location during read operations. With this arrangement, flush through defects can be detected which would not have been detectable by prior BIST machines.

17 Claims, 2 Drawing Sheets

TEST CONVERAGE OF EMBEDDED MEMORIES ON SEMICONDUCTOR SUBSTRATES

This is a continuation of application Ser. No. 08/450,431, filed on May 25, 1995, now abandoned.

BACKGROUND OF THE INVENTION

This invention relates generally to testing of memories, and more particularly to built-in self-tests for embedded memories on semiconduct substrates. In even more particular aspects, this invention relates to a method and structure for performing built-in self-test procedures to detect errors caused by circuit defects which would not otherwise be detectable using conventional test procedures.

BACKGROUND ART

A built-in self-test (BIST) state machine is used in many cases to test embedded memories, which memories form a portion of a microprocessor or other integrated circuit chips, which in turn are used in computers, and other similar devices. The BIST is formed on the same substrate on which the embedded memory is formed and generates various test patterns and signals to test the memory. This test is typically applied following manufacturing of the chip to determine if the memory is good, although the test can be applied at various times/stages, including during boot operations on the integrated circuit where it is incorporated into a system, such as a computer.

Typically, during the application of various test patterns, BIST will perform "write" cycles wherein it writes data to addressed memory locations. This is followed by "read" cycles wherein the previously-written data is read. The BIST machine also generates "expect data" which during a read cycle corresponds to the data which was written in a previous write cycle. This expect data is compared to the data read from the memory on a read cycle to determine if there is failure of any of the memory's storage cells or circuitry.

This technique generally works quite well in detecting most of the failure mechanisms associated with embedded memories, including the locations of defective storage cells. However, prior art techniques have had one drawback in the case of embedded memories which have separate data input (DI) ports and data output (DO) ports such as those used in high performance microprocessor's caches. This drawback is that if a test is being performed wherein data is first written on one cycle and then read on another cycle, if, during the read cycle, there is a defect in the memory such that the write function remains active due to a stuck write enable switch or certain types of misconnections of circuitry, or other circuit defects such as shorts, etc., this may cause a write operation to take place during the read cycle even though the write operation should not be enabled. This results in the data at the memory's DI port being flushed through to the memory's DO port and being read out instead of the data actually stored at the addressed cell location being read out. With conventional prior art techniques, the expect data is the same as the stored data in the memory and has the same binary value, i.e., "1" or "0" as data present at the memory's DI port. Under these circumstances, a defect causing the write to occur on a read cycle will not be found since the data being written during what is supposed to be a read cycle will correspond to the data which has been stored, and hence no failure will be detected even though what is being read is not the data stored, but rather the data being written or more correctly the data being written which overwrites the previously stored data. Moreover, since the data being written is being compared with the expect data rather than data read from the memory storage, if there is a bad cell, for example, this will not be detected since the write operation overpowers the read operation and supplies flush through data at the data output terminal.

Some memory BISTs use an on chip ROM (read only memory) to test embedded memory. In conjunction with other test circuitry, the ROM supplies the memory under test with input data and address during write cycle and comparison (expect) data to compare circuitry at the memory's output during read cycles. Since the ROM based BIST uses the same data for both memory input data and expect data, it is also suspectable to defects which allow data to flush through the memory under test. Another memory BIST uses linear feedback shift registers (LFSR) for data and address generation and captures memory output into a multiple input signature register (MISR). With this type of BIST, no expect data is generated. After reading the entire memory under test, the contents of the MISR is compared with a hardcoded or program-generated signature of a known good memory contained either on the chip or in an external tester. Since the LFSRs are used during read cycles to provide addresses to the memory, the same data as was previously written is applied to the memory's input during read cycles. If flush through faults are present, the data at the memory input will simply flush through to the memory's data output port. This will result in the capture of a good signature in the MISR and for the flush through defects to go undetected.

Therefore, it is a principal object of the present invention to provide a method and apparatus for testing memories, including embedded write through memories, to determine circuitry defects that enables a write function during a read only cycle.

SUMMARY OF THE INVENTION

In prior BIST implementations, memory flush through faults cannot be detected since the test input data and expect data have the same logic value during read cycles. If flush through faults exist, test input data simply passes through the memory and compares favorably with the expect data. This results in defective hardware being judged as good by BIST. In the presence of flush through faults, other types of faults are also masked if tested in this manner. For example, if a memory contains a stuck on write enable control and defective wordline decoding circuitry, neither fault will be detected if test input data and expect data have the same value. Therefore, BIST must invert the test data present at the memory's input during read cycles in order to reveal the presence of flush through faults previously masked.

In order to detect flush through faults (stuck on write control, shorted write bit switch, etc.) in embedded memory, a BIST state machine is provided which changes the data applied to the memory's DI port during read cycles to a value different from that of the data stored in the currently addressed memory location. If used, BIST-generated expect data is also at a different value from that of data at the memory's DI port and at the same value as the data stored at the current memory address location during read operations. With this arrangement, flush through defects will be detected since the value of data read out of memory will not match the expect data.

In the case of ROM or LFSR/MISR based memory BIST architectures, the circuitry disclosed to invert data inputs during read cycles needs to be placed between the data outputs of the ROM or LFSR and the data inputs of the memory under test in order to detect flush through defects and thus enhance fault coverage.

DESCRIPTION OF THE PREFERRED EMBODIMENT(S)

Figure 1:
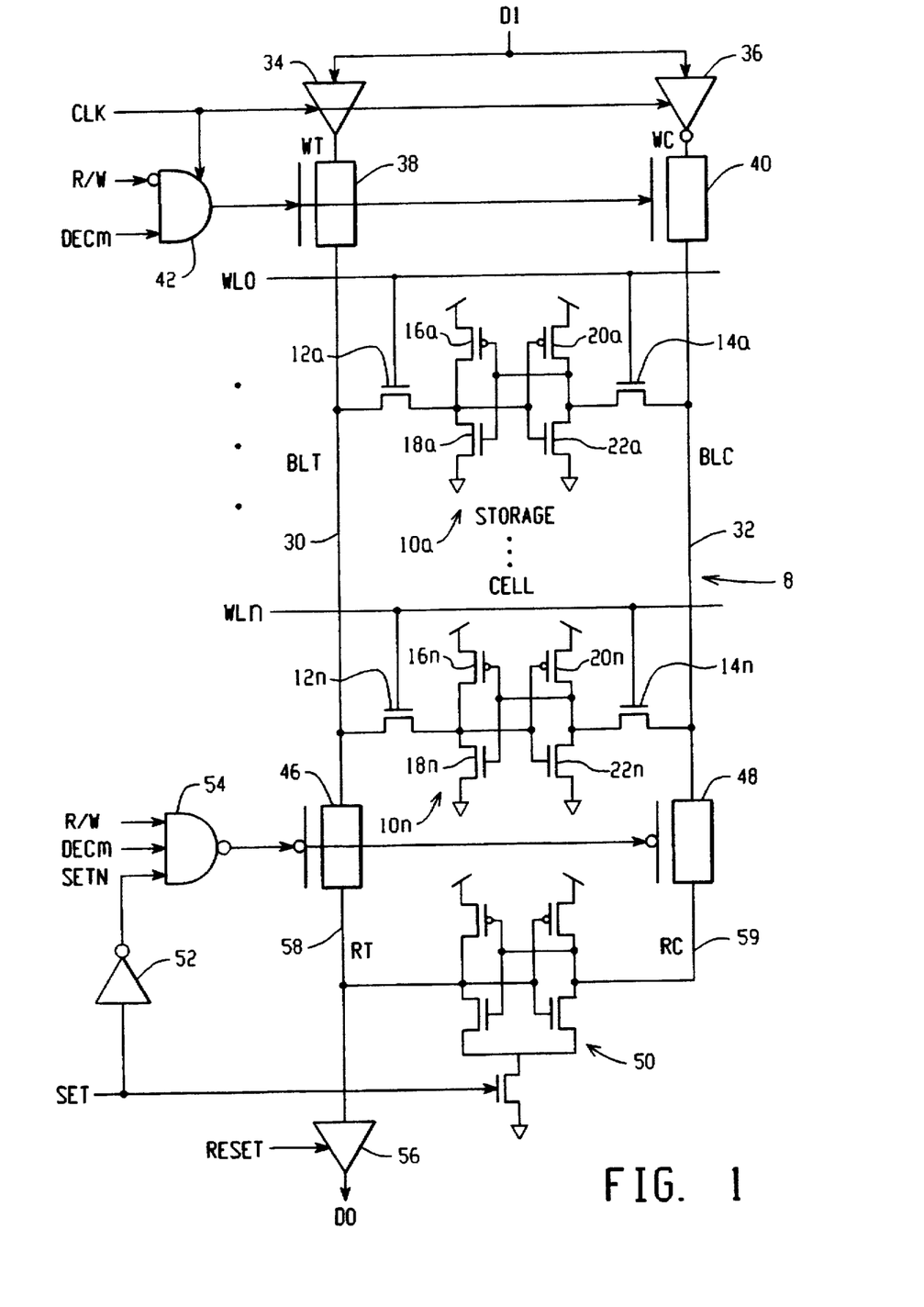
FIG. 1 is a circuit diagram, somewhat schematic, showing a portion of a bit slice data path in a static RAM.

Before describing the present invention and its operation, it is believed that a description of the operation of a bit slice or column data path for certain types of SRAMs (static random access memories) to be tested according to this invention will be useful. To this end, a portion of the bit slice path of an SRAM is shown in FIG. 1. The bit slice path is a portion of a memory designated generally by the reference character 8 and includes a series of storage cells designated generally by the reference characters 10a-10n.

Each of the storage cells 10a-10n statically stores a single bit of information either as a logic "1" or a logic "0" therein which is written during write operations and read during read operations. Each of the storage cells 10a-10n is a so-called "six device storage cell" which is conventional and well known in the art and need not be described in any great detail other than to indicate that they include a pair of NFETs 12a-n and 14a-n often referred to as transfer devices, as well as a cross coupled latch or inverter pair formed by transistors 16a-n, 18a-n, 20a-n and 22a-n connected in a well-known manner to provide a head-to-tail feedback configuration of a pair of inverters as is well known in the art. The gates of the transistors 12a-n and 14a-n are connected to the respective wordlines WL0 through WLN. One side of each of the transistors 12a-n is connected to the true bitline 30 indicated by BLT, and transistors 14a-n have one side connected to the complement bitline 32 indicated as BLC. Essentially, the BLT line represents the data that is written to the cell, and BLC represents the inversion or complement of the same data which is written. This is accomplished by providing wordline drivers in the form of a buffer 34 and inverter 36, each of which receives as its input the data at port DI (data in). Data is clocked out of the buffer 34 and inverter 36 by a clock CLK, and said data is presented respectively to a write bit switch 38 connected to the BLT line 30, and the write bit switch 40 connected to the BLC line 32. Both of these switches 38 and 40 are NFETS in this embodiment. The gates of transistors 38 and 40 are connected to AND gate 42, which has as one of its inputs the read/write (R/W) control signal, which in the preferred embodiment is a read "high", write "low" signal. The other input to AND gate 42 is a decoded bit slice select or column select signal (DECm) where m is one of some number of possible column selections decoded from the memory's bit addressing. The true bitline 30 is also connected to a PFET 46, and the complementary bitline 32 is connected to a PFET 48. The transistors 46 and 48 are the read bit switches which have as outputs the RT (read true) and RC (read complement) datalines, respectively, and are actuated by the output of a three input NAND gate 54 which includes as inputs a R/W signal, a decoded bit slice select (DECm) signal and a SET NOT (SETN) signal which is received from an inverter 52 which in turn receives its input from the SET signal which also drives sense amp 50. The output of the read bit switch 46 is supplied to output driver in the form of a buffer 56 which drives data out (DO).

The operation of the memory is well known in the art. However, a brief review of its operation will be beneficial in understanding the import of the present invention.

The data to be written to the memory is applied at a data input port (DI). The data is clocked through buffer 34 and inverter 36 via the clock input (CLK). The buffers 34 and inverter 36 generate from the input at DI a true/complement data pair (WT and WC, respectively), which are used to drive the respective write bit switches 38 and 40. Address decode logic (not shown) brings up one of the wordlines (WL0 . . . WLh) used to select the storage cell to be exercised as is well known in the art. The BLT line 30 and BLC line 32 connect to the respective true and complement inputs which are on opposite sides of each storage cell. The sense amp 50 and output driver 56 are isolated from the storage cells by the read switches 46 and 48, as is well known in the art.

During a write cycle, the read/write (R/W) control 42 is driven low, and one of the column decodes, DECm, is asserted. The ANDing of the R/W and DECm signal steers the input data to the proper bit column to be written (in this case, the column which is shown as the bit slice). Input data is strobed through the buffer 34 and inverter 36 onto the WT and WC lines, and through the write bit switches 38 and 40 and onto the BLT and BLC bitlines 30 and 32, respectively, connecting the storage cells 10a-10n. At this point, it should be noted that prior to every cycle, the BLT and BLC lines 30, 32 are precharged to a high state, which state is conventionally that of the VDD voltage level of the memory by circuits, not shown but which are well known in the art. One commonly used VDD voltage is 3.3 volts. In any event, both the BLT and BLC lines are precharged to a predetermined high voltage state before each cycle, i.e., before each write cycle and each read cycle.

Strobing of the data through the write bit switches 38 and 40 results in either the BLT line 30 or BLC line 32 being pulled from its precharged high state to ground, while the other bitline is held at its precharged high level, in this case VDD. This is because on one of the lines 30 or 32, a high or logic "1" is driven by write buffer 34 or write inverter 36, and on the other a low or logic "0" is applied by either 34 or 36. In a system where the level of VDD is 3.3 volts, the potential difference between the bitline BLT 30 and BLC 32 would be 3.3 volts during a write operation. The addressed one of n wordlines WL0-WLn turns on the two transfer devices 12a-n and 14a-n connected to the asserted wordline. One input to the cell "sees" the precharged high bitline, while the other input "sees" the bitline which is being pulled low. This results in the cell being written with the value on bitline BLT 30. During a write cycle, the read bit switches 46 and 48 are turned off if the memory is a non-write through memory; however, if the memory is a write through and is being tested in the write through mode, the read bit switches 46 and 48, respectively, will be turned on, as will be described presently.

A read operation occurs on every write cycle in a write through memory in a write through mode, i.e., on every write cycle a read operation takes place. Thus, the read bit switches 46 and 48 are actuated for a write through operation, and output driver 56 drives a "1" or "0" depending upon what value is on the BLT line 30.

During a read cycle, the SET signal is initially low, and a decoded column address (in this case, DECm) is asserted. The NANDing of the DECm and SETN turns on the PFET read bit switches 46 and 48 for bit slice m in a write through memory. In a non-write through memory, a R/W control is also NANDed with a SETN and DECm. The decoded wordline selects the storage cell in a bit slice to be read. The selected cell begins to discharge one of the two precharged high bitlines 30 or 32 once the transfer device switches 12a–n, 14a–n are turned on by the wordline going high. The bitlines are generally long and have relatively high capacitance, while the cell's pull down devices are typically narrow which results in the bitline discharging slowly. If the selected cell contains a stored "0, the cell would begin to discharge bitline BLT 30. If the cell contains a "1", the cell will begin to discharge bitline BLC 32. After some amount of time (e.g., 800 ps), a small potential difference develops between the bitlines 30, 32 due to discharging of one of the two bitlines 30, 32 by the selected cell 10a–10n. The SET signal to the sense amp 50 is timed to go active when a potential difference large enough to be sensed by the sense amp 50 (e.g., 200–300 mV) is present between the bitlines. When the read bit switches 46 and 48 are open, any potential difference between the BLT and BLC lines 30 and 32 is applied across the sense amp's input via output lines 58 and 59. The SET signal going high causes the sense amp to set with the value which corresponds to the value stored in the read cell. This causes the output driver to drive out a binary value representing the sensed cell value. The SET signal going high also causes the read bit switches 46 and 48 to shut off after an inverter-NAND gate delay. This limits the amount of bitline charge being dumped to ground when a latch-type sense amp 50 is used. The wordline and decode signals are then reset, followed by the bitlines being precharged high.

In a commonly used SRAM design approach, the output of the write driver 34 and write inverter 36 evaluates each cycle, even during read cycles. This design approach requires that the write bit switches 38 and 40 be "off" during read cycles since input data at the DI port will propagate through buffer 34 and inverter 36 to the input of the switches 38 and 40. That is, either the WT or WC line will be driven low in a given cycle. Thus, in order to read the data that has previously been written into any particular storage cell, the write bit switches 38 and 40 must be off since, if both of the switches 38 and 40 are active during a read cycle, then either the BLT line 30 or BLC line 32 will be pulled to GND. If only one of the write bit switches is stuck on or shorted, then its associated bitline is only pulled to GND if the associated write driver's output evaluates to a "0". When the SET signal goes high in a read cycle, the potential difference across the bitlines will be about 3.3 volts in the presence of a flush through fault. This causes the sense amp to set in the direction which reflects the value of the data at the DI port as would occur during a write through operation. The SRAM output driver 56 will therefore drive out a value equal to what is presented at the DI port rather than what is stored in the cell 10a–10n being read. For example, if a "0" is present at the DI port during a read cycle, WT will be driven low. If the write bit switch 38 is defective, stuck on or shorted, then BLT line 30 will be pulled low. Since this is a read cycle, the PFET read bit switches 46 and 48 will be "on" and line 58 will be pulled down toward $V_{tp}$, where $V_{tp}$ is the PFET threshold voltage (for example, 0.6 volts) by write driver 34, while line RC remains at VDD. When SET is asserted, the sense amp will set in the direction which causes the output driver 56 to drive a "0". Hence, if for any reason during a read cycle either of the write switches 38 or 40 or both of them are "on", then the data stored in the storage cell 10a–10n being actuated may not be read, but rather the data asserted on the input port DI might be read even though the intended data to be read is the data in the particular storage cell 10a–10n. It should be noted at this point that it does not matter whether the data in the storage cell is the same or different from the data on line BLT 30 since the write operation overpowers the read and supplies such a value to the BLT line 30. (It must be remembered, of course, that during read cycles in prior BIST implementations, the test data present at the memory's DI port, the expect data, and the data stored in the selected storage cell were all at the same logic value during testing of the memory.)

Figure 2:
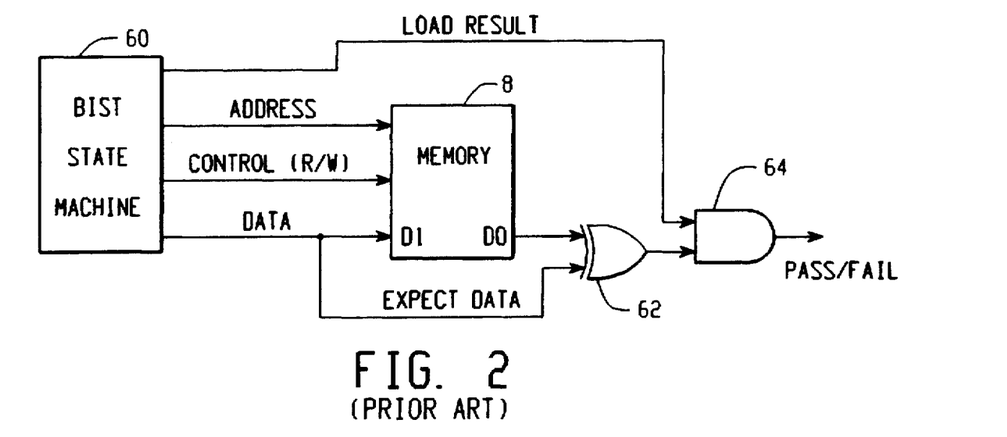
FIG. 2 is a high level diagrammatic representation of the prior art configuration for testing memories.

With the above facts in mind, reference is now made to FIG. 2, which shows a conventional prior art technique for testing a memory 8 using a BIST state machine 60. For example, one such BIST is shown and described in U.S. Pat. No. 5,173,906. For multiple memories, a BIST of the type shown in application Ser. No. 08/398,468, filed Mar. 3, 1995, and entitled "BIST Tester for Multiple Memories" (Atty. docket BU9-94-146: 21323/00164) can be used. (However, other BISTs can be used.) It should be noted that any of the embedded memory test architectures, including ROM or LFSR/MISR based memory BIST architectures, can suffer the same inability to detect flush through faults as the state machine base BIST discussed below. The BIST 60 generates data and control signals, including address signals, a control R/W signal and data to be conveyed as data input to the DI port. The generated data is also supplied as one input of XOR gate 62, the other input of which is the DO or data out which is the data read from the output driver 56 shown in FIG. 1. The generated data constitutes the expect data (ED). The output of the XOR gate 62 is delivered as one input to AND gate 64. The other input of which is a load result (LR) signal. In its simplest form, data is written to data input (DI) during a write cycle. The data input DI is driven by the BIST and, when applied to a non-write through memory, the data output is turned off, as described with reference to FIG. 1. This results in the data being written to the desired cell 10a . . . n.

During a subsequent read operation, the bit switches 38, 40 are turned off, and the read bit switches 46, 48 and the data output driver 56 is turned on. The same data that was generated during the write cycle is generated during the read cycle as expect data (ED), but since the input data bit switches 38 and 40 (FIG. 1) are turned off, the data is not written to the memory, but the data already written is read since the read bit switches 46 and 48 are turned on. This results in the data that was previously written to the memory being read out at DO to XOR gate 62; and at the same time the expect data which is the same data that had previously been written is also applied at the input of XOR gate 62. (To facilitate understanding of this invention, a truth table for an XOR gate is shown in Table I.)

TABLE I

| A (IN) | B (IN) | XOR (OUT) |
|---|---|---|
| 0 | 0 | 0 |
| 0 | 1 | 1 |
| 1 | 0 | 1 |
| 1 | 1 | 0 |

If the expect data and the data out are the same, the XOR 62 gate will deliver a logic "0" output signal to the AND gate 64. If the load result signal is actuated, the AND gate 64 will output a pass/fail signal, where a pass signal (logic "0") indicates that the data read out at the memory's DO port and the expect data are the same, or a fail signal (logic "1") which indicates that the expect data is different from the data read out. As was indicated above, during a read cycle the write bit switches 38 and 40 should not be on; however, if for some reason there is a defect that causes one or both of the write bit switches 38 or 40 to turn on or for any reason allows data to pass, the data being read as data out will not be the data stored in the storage cells, but rather will be data written as the data in at the DI port. This then causes at least three problems. First, it cannot be ascertained whether the storage cell being tested has failed or not, since the information stored therein is not being read, but rather data which is being written is being read and compared with the expect data. Second, the malfunction or failure which is causing the switches 38 and 40 to pass data will not be detected since the data out will match the expect data inasmuch as the expect data is the same as the data being written as data in. Expressed another way, the data being written is compared with the data being read, and therefore not with the data stored in the cell, and a true test is not obtained. Third, other failure mechanisms which may be present are hidden. A wordline could be stuck high for instance. Unique address test patterns will not detect this condition if data is imply flushing through the memory.

Figure 3:
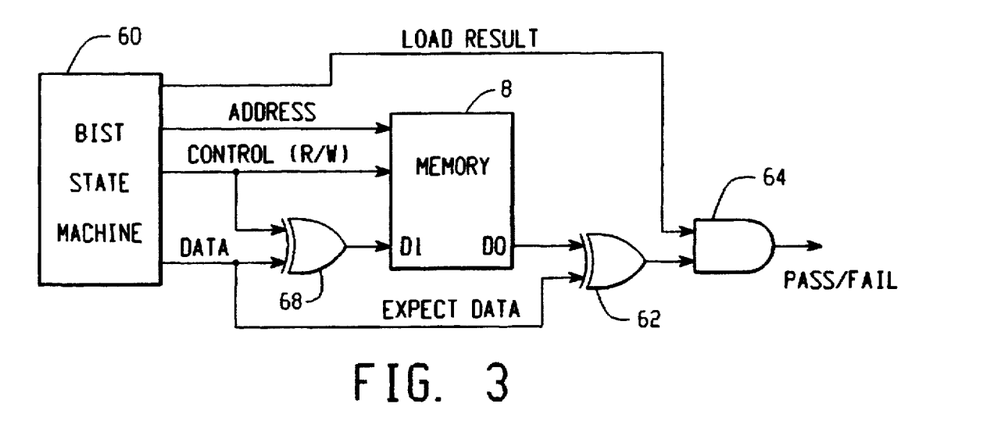
FIG. 3 is a test configuration for testing memories according to one embodiment of the present invention.

To remedy this, the logic circuit shown in FIG. 3 is provided which will "catch" the fact that, for some reason such as stuck switches 38 or 40 or other circuit defects which allow data to pass during a read cycle when it should not, this will be flagged as a fail. To this end, as shown in FIG. 3, an XOR gate 68 is provided which receives the data being generated from the BIST state machine 60 as one input, the other input of which is the control signal R/W for the read/write. The output from the XOR gate 68 is the "data in" or the input data to the DI port of memory 8 being tested. The expect data is not passed through the XOR gate 68, but rather is applied directly as one input to XOR gate 62, the other input of which is the data out (DO) from the memory 8. This XOR gate 62 acts in the same way as the XOR gate 62 of the prior embodiment to output a signal to AND gate 64, which has a load result (LR) signal which enables a pass/fail as output of gate 64.

During a write cycle wherein data is to be written to the memory 8 under test, data is presented at one input to the XOR gate 68. The other input to XOR gate 64 is the control signal from the read/write enable, which during a write cycle is low. Therefore, the output from the XOR gate 68 is the same as the data supplied to the XOR gate 68 as input, i.e., is not inverted, so the same data during a write cycle that is being applied as data into the memory is supplied as expect data. However, on a conventional write cycle in which a read is not taking place, the load result signal LR is not actuated so that no pass/fail signal is generated.

After the write cycle, the BIST state machine 60 then enters a read cycle wherein the data written on the previous cycle is read from the memory 8. During this subsequent read cycle, the same data is generated by the BIST machine as was written, and it is delivered directly as expect data to the XOR gate 62. However, during a read cycle, the control signal (R/W) to the XOR gate 68 is actuated so that the output of the XOR gate 68 is inverted, thus inverting the input data. Hence, during a read cycle, the data in (DI) is inverted from what was previously written at the presently addressed memory cell location. During the read cycle when the data out switches 46 and 48 are actuated to provide the output from the output driver 56 and the write switches 38 and 40 are off, the expect data and the data out are XORed in XOR gate 62. If the data being read is the data that was stored in the storage cell 10a-10n and it compares with the expect data, then a "0" is sent to the pass/fail since the expect data and the data out compare. When a load result signal is actuated, it will show a pass logic "0".

On the other hand, if for some reason during the read cycle, data is being written onto the BLT and BLC lines 30, 32 because of some flush through failure, the data being written will be the inverse of the expect data, since during a read cycle the XOR gate 68 is actuated to invert the input data. If the data out is then the same as the data in, the data out will be inverted from the expect data, which will generate a logic "1" at the output of XOR 62 and, upon the load result signal being actuated, will indicate a failed test. Thus, if during a read cycle of the memory 8, data is being written to the memory cells via the BLT and BLC lines 30, 32 due to a flush through defect, this will overpower the read function and will be outputted as data out, which data will be the inverse or complement of the expect data, and thus show a fail. Getting memory output which is inverted from the expect data does not necessarily indicate that the failing mechanism is due to a flush through defect. Wrong data at the DO port could also result from a bad storage cell, a stuck bitline, faulty output circuitry, etc. However, in the absence of all other defect types, except for flush-through defects, inverting data inputs is required to detect them.

Table II below shows in tabular form certain test operations using this invention and how they would work in both non-write through memories and write through memories. The read/write column shows the value or state of the read/write control, wherein R/W equals "0" is a write and R/W equals "1" is a read function. The data in (DI) column displays the value of data applied to the memory DI port. Data in is shown as DI over the data in as either a "1" or a "0". Expect data is shown as ED where the expect data is either a "1" or a "0". Data out (DO) is shown as either a "1" or a "0" or an "X" indicating don't care. Load result signal is a control signal which is either a "0" or a "1", a "1" indicating a load result and a "0" indicating that the function is not active. Pass/Fail is a "1" or a "0", "0" indicating a pass and a "1" indicating a fail, or more properly, a "0" representing that a failure was not indicated.

TABLE II

|  | W | R/W | DI | ED | DO | LR | P/F | COMMENTS | LT |
|---|---|---|---|---|---|---|---|---|---|
| Non Write-thru | 1 | 0 | 1 | 1 | X | 0 | 0 | Write a 1. LR inactive | 1 |
|  | 1 | 1 | 0 | 1 | 1 | 1 | 0 | Passing read of a 1. | 2 |
| Memory Example | 1 | 1 | 0 | 1 | 0 | 1 | 1 | Failing read of a 1. Get 0 out | 3 |
| Write-thru | 0 | 0 | 0 | 0 | 0 | 1 | 0 | Passing write-thru of a 0. | 4 |
| Memory Example | 0 | 0 | 0 | 0 | 1 | 1 | 1 | Failing write-thru of a 0. Get 1 out. | 5 |
|  | 0 | 1 | 1 | 0 | 0 | 1 | 0 | Passing read of a 0 | 6 |
|  | 0 | 1 | 1 | 0 | 1 | 1 | 1 | Failing read of a 0. Get 1 out. | 7 |

W = Write Data
R/W = Read/write
DI = Data In
ED = Expect Data
DO = Data Out
LR = Load Result
P/F = Pass/Fail Table II indicates how the configuration of FIG. 3 works for certain read/write operations. Line 1 shows that during a write operation, the read/write control line is a "0", the data generated by the BIST is a "1", data in is a "1", expect data is a "1", data out is a don't care, and the load result is a "0" and pass/fail signal is a "0". The reason for data out as don't care is that during a write function on a non-write through memory, no valid data is being outputted so a pass/fail test is not being performed. The only function being performed is writing data to the memory. On line 2, a read function is being performed as indicated by the "1" in the R/W column. The BIST generated data in is a "1" which XOR gate 68 inverts to a "0" as depicted in the memory data input DI column. The expect data is a "1" since that is what the storage cell was written with during the prior write operation. If the data out is a "1" and the load result is a "1", a "0" pass/fail indication is given indicating that the expect data matched the data that was actually stored in the memory, and the data was not flushing through, but that the actual storage cell content was being read, and that it was read correctly, and therefore this indicates a pass. On line 3, there is an example of a read operation wherein, again, the data in is a "0", the expect data is "1", as is the data generated, but in this case the data out is a "0". The load result control signal is a "1". Since there is different data out than expect data, a pass/fail signal of "1" is generated, indicating that there is a failure. This pass/fail could indicate one of many types of conditions. One condition is that there is a defect in the storage cell which did not properly store the data written as a "1" and it was read as a "0" indicating a fail. Another possible failure mechanism is that, for some reason, there was a circuit failure on the write mechanism which caused the data in to be written onto the WRT and WRC lines; however, since the test was in a read mode, the data was inverted from the expect data and thus the indication of a failure is given. Based on this alone, whether the failure was in a cell or in the circuitry controlling the write function is not ascertainable. Nevertheless, it indicates a fail and, if no redundancy is available, then the result is a scrapped chip. Techniques for more precisely isolating the failure will be discussed presently.

With respect to a write through memory, line 4 indicates a write cycle since the R/W control is low. (It should be noted that on a write through memory, the read bit switches 46 and 48 are turned on during a portion of the write cycle as well as during a portion of the read cycle.) Again, with respect to line 4, on a write through memory, during a write cycle the write line is "0", therefore the data in is "0", the expect data is "0" and, if the data out is a "0" which is the expect data, the ANDing of the active load result signal and the "0" data out result in a "pass" indication (i.e., logic "0") at the AND gate output. In line 4, again on a write cycle, the data in is a "0" and the data out is a "0" since on the write cycle the data is not inverted. However, if the data out is a "1" (line 5), this is different from the expect data. Since load result is active "1" in order to verify the write through operation, the pass/fail signal of "1" is indicated, indicating that the memory has failed in that the data out was not the same as expect data, which in turn was the data being written during the write cycle.

Turning to line 6 in Table II with respect to the write through memory, this represents a read cycle for reading data that has been written on a previous cycle but is not presently being written on this cycle. Therefore, the read/write line goes high to a "1". If a "0" is being supplied by the BIST machine, this will be inverted to a "1" by the XOR gate 68 and applied to the memory's DI port, but the expect data will be "0" and, if in the read cycle the stored data read out is a "0", then it will compare with the expect data, indicating that the data in is not being written and that the data actually stored is being properly read, and when the load result signal goes high it will indicate a pass.

In line 7, which is also a read cycle indicated by the "1" in the R/W column and again when the generated data is "0", the data in is inverted to a "1" by the XOR gate 68; however, since the generated data is "0", the expect data will be "0". If the data out is actually a "1", it indicates that there is some kind of a malfunction of the memory. This could be from a faulty storage cell which changed from a "0" to a "1" during storage, or it may be that there is some circuit defect in the write circuit causing the data in to be written when it should not be during a read cycle, or possibly other defects.

The description as given above, especially with respect to Table II is true if both the write bit switches 38 and 40 are stuck on or shorted. For example, if a "0" is stored in the cell to be read, and a "1" is applied at the DI port with both bit switches 38 and 40 being stuck on, bitline WT will evaluate to a "1" and bitline WC will evaluate to a "0" when the clock CLK is asserted at the beginning of the cycle. Since both bit switches 38 and 40 are on, the buffer 34 driving the WT line will overpower the cell's attempt to discharge bitline BLT, while the complement bitline driver pulls bitline BLC from its precharged level to ground. The addressed cell will actually be overwritten by the data on the DI port. When the sense amp 50 sets, it will cause the output driver to output a logic "1". The expect data will equal the "0" that was overwritten in the address cell. Comparison of the expect data and the memory data output will therefore generate a miscompare, causing the flush through problem to be detected.

Now assume the defect is a stuck on or shorted true write bit switch 38, which connects the true bitline BLT 30 to the write driver's 34 output WT, the cell being read contains a "0", and a "1" is applied to the DI port. It will become apparent that detection of a single stuck on or shorted write bit switch is dependent on the value of the data stored in the cell, as well as the value of the data at the memory's DI port. A discussion of four data sensitive defect scenarious is presented below: (1) During the read operation, the complement write bit switch 40 is off, and the storage cell being read attempts to maintain bitline BLC 32 at its precharged value of VDD. Meanwhile, write buffer 34 "fights" against the storage cell's attempt to pull down bitline BLT by driving a high through the stuck on or shorted true write bit switch 38. If the bit switch is stuck on (gate held at VDD), the maximum voltage that the write driver can drive bitline BLT to through the NFET is VDD-$V_{tn}$ where $V_{tn}$ is the threshold voltage of the NFET. Because bitlines BLT and BLC, and datalines WT, WC, RT and RC are precharged to VDD at the end of the previous cycle, the stuck on NFET write bit switch 38 is "cut-off" at the start of the present read cycle since its gate-to-source voltage ($V_{gs}$) and gate-to-drain voltage ($V_{gd}$) are both zero volts and since $V_{gs}$ is less than $V_{tn}$, e.g. 600 mV. Because the voltage at which the sense amp set, e.g. 200–300 mV is less than $V_{tn}$, the storage cell will be able to pull bitline BLT down enough to establish the potential difference necessary to cause the sense amp 50 to set to a value of "0" which leaves the stuck on true write bit switch undetected. Now consider the case of a shorted true write bit switch. Again, the cell tries to maintain the precharge level on bitline BLC while trying to pull down bitline BLT. The write driver 34, however, has much more drive strength than the cell and may in fact hold the voltage on bitline BLT very close to VDD. In this situation, such factors as temperature, noise, resistance of the short, and other process parameters play a role in determining the outcome.

(2) In the second scenario, the driven bitline BLT "wins out" over the undriven bitline BLC and causes the cell to "flip," the "0" being overwritten with a "1". In this case, a "1" is read out at the memory's DO port, compared with an expect value of "0", and the defect caught. (3) In the third scenario, the resistance of the short is such that the cell is able to pull down bitline BLT enough to cause the sense amp to set with a value of "0" which would cause the defect to go undetected for this data type, i.e., a "0" stored in the cell. (4) In the fourth scenario, both bitlines BLT and BLC remain at approximately VDD. When the SET signal is actuated, the sense amp may set with either binary value. The result is the direction in which the sense amp 50 sets is not certain, and BIST may detect the failure or may fail to detect the failure for this data type, i.e., a "0" stored in the cell. However, BIST is commonly designed to apply both "true" and complement" data to memories under test. If BIST fails to detect a defect during its first pass, the chances of catching the defect in its subsequent pass with complement data is virtually certain. In the next pass, BIST will write the cell with a "1" and then attempt to read the "1". During the read operation, a "0" will be present at the DI port and the output WT of the write driver 34 will evaluate to a "0". Scenario 1: In the case of a stuck on NFET write bit switch 38, the write driver 34 will be able to pull bitline BLT fully to GND causing the content of the cell to be overwritten. This results in a "0" being read out at the DO port, thus guaranteeing detection of the stuck on write bit switch which went undetected when opposite data was applied. Returning to the shorted write bit switch scenarios (2–4), if the short is ideal (0 ohms), or within some low resistance range, write driver 34 will discharge bitline BLT close enough to GND to "flip" the cell and thus cause the defect to be caught. In the case of more resistive shorts, the voltage drop across the resistance is initially 3.3 volts {3.3 volts (on the precharged bitline BLT) minus 0 volts (at the output of write driver 34 once the CLK is asserted)}. Therefore, write driver 34 is initially able to sink 3.3 v/Rs amps of current where Rs is the resistance of the resistively shorted write bit switch. It should also be noted that the PFETs 16a–n, 20a–n in storage cells 10a–n are generally weak keeper devices with widths narrower than the NFET pulldown devices 18a–n, 22a–n, e.g. Wp=½ Wn, where Wp is the width of the PFET device and Wn is the width of the NFET device. Under these circumstances, the PFET keeper device 16a–n in the currently addressed storage cell with its limited current sourcing capability attempts to maintain bitline BLT at its precharged level while write driver 34 with its vastly superior current sinking capability attempts to discharge bitline BLT. Buffer 34 will be able to pull bitline BLT at least 200–300 mV closer to GND than the cell's discharging of bitline BLC can provide. Thus, sense amp 50 will set such that a "0" is read out of the memory when a "1" was expected, and the fail will be caught. From the above discussion, it can be seen that single write bit switch faults can be data sensitive. Thus, both true and complement data should be written to a cell and then read while data present at the DI port is inverted, in order to detect a single stuck on or shorted write bit switch.

Certain memories are designed such that the gate voltage for the NFET write bit switches 38 and 40 is at VDD during read cycles and the output of the buffer 34 and inverter 36 (lines WT and WC) remain at their precharged high level. Bitlines BLT and BLC 30, 32 are at VDD due to precharging at the end of the previous cycle as indicated above. Under these conditions, transistors 38, 40 are "cut-off" since their gate-to-source voltage ($V_{gs}$) and gate-to-drain voltage ($V_{gd}$) are both 0 volts and since $V_{gs}$ is less than $V_{tn}$. If a read operation now occurs, one of the bitlines BLT 30 or BLC 32 will begin to discharge slowly through the cell being read. Since the voltage at which the sense amp sets, e.g. 200–300 mv, is less than $V_{tn}$, the voltage at which the write bit switch is turned on, e.g. 600 mV, it doesn't matter that the gates to the write switches 38, 40 are driven high during the read cycle. The sense amp 50 will have set, and the read bit switches 46 and 48 will have turned off before the voltage difference between the discharging bitline and the gate of the associated write bit switch reaches the voltage necessary (VDD–$V_{tn}$) to turn on either NFET 38 or 40. In this type of memory design, inverting data inputs will catch faults which lead to lines WT and/or WC evaluating during a read cycle. If line WT or WC evaluates to a "0", the associated write bit switch will turn on since $V_{gs}$=VDD which results in the inverted data at the DI port flushing through to the memory's DO port.

The addition of the XOR gate 68 in the data path which is actuated by the read/write signal to invert the memory DI during BIST read operations is a relatively simple, straightforward solution which can detect flush through defects. It should be noted that the expect data can't simply be made the inversion of the memory input data. In write through memories, data written to the cell also appears on the memory's output in the same cycle. That is, in write through memory both the write and read bit switches are turned ON during a write operation while during a read operation only the read bit switches are enabled. Thus, a write through memory has the capability of being written through during a write cycle and the ability to store written data which can be subsequently retrieved during read cycles. BIST confirms write through is functioning by enabling the comparison logic during write cycles also. Since the proposed BIST implementation must test write through memories also, it must possess the capability to source match memory input data and expect data during write cycles and memory input data at the opposite logic state to that of expect data during read cycles. This function is accomplished by the use of XOR gate 68.

Other hardware and programming implementations can be made to provide more specific information regarding the type of failure and can breakoff testing when a particular type of failure has been found if no redundancy is available. If there is a shorted write bit switch or stuck on write control, the chances are quite good that it will be detected very early in the testing using the circuitry of the present invention as shown in FIG. 3. If the BIST is sequentially incrementing through the word address lines, then WL0 will be brought up first, followed by WL1, and in a subsequent cycle WL2, and so forth through WLn. Chances are very good that a stuck write switch fault will be found at the WL0 location, and cycling through the remaining wordlines will do no more than confirm the existence of this fault. A programmable pattern as described in U.S. Pat. No. 5,173,906 can be utilized to quickly check for the presence of faults revealed by inverted data inputs during read cycles. This pattern would be run before other BIST patterns to determine if further testing should proceed thereby avoiding needless reconfirmation of existing faults and shortening test time. The programmable pattern is implemented by programming BIST via scan initialization to remain on WL0 in the case of no redundancy. The programmable pattern first writes the bit decoded column with a "0". Then, a read cycle takes place wherein the bit column at WL0 is read while a "1" is applied to the DI port and a "0" is expected at the DO port. If a "1" was read out, it would indicate that a flush through fault or some other fault mechanism was present. The read/write sequence is then repeated with the data inverted since flush through faults are data sensitive. Thus, in four cycles, it can be determined whether or not to proceed with testing. If the chip has no redundancy (i.e., extra rows or columns of storage cell for chip repair), a chip could be determined scrappable immediately if it failed the first pattern. If word-line redundancy is available on a chip, the programmable pattern can be programmed to sequence through the word-lines until redundancy is exhausted. For example, if there are two rows of redundancy available and a stuck on write control is present, then the pattern will run through WL0 to WL2 and stop. Since fails would be found at all three wordlines, the internal OVERFLOW signal from the BIST redundancy circuitry would go active indicating that further testing of the memory would not be useful. If no fails were found with this first pattern, it assumes that no flush through faults existed and the remaining BIST test patterns can be executed without further need to invert the data inputs during read cycles.

Figure 4:
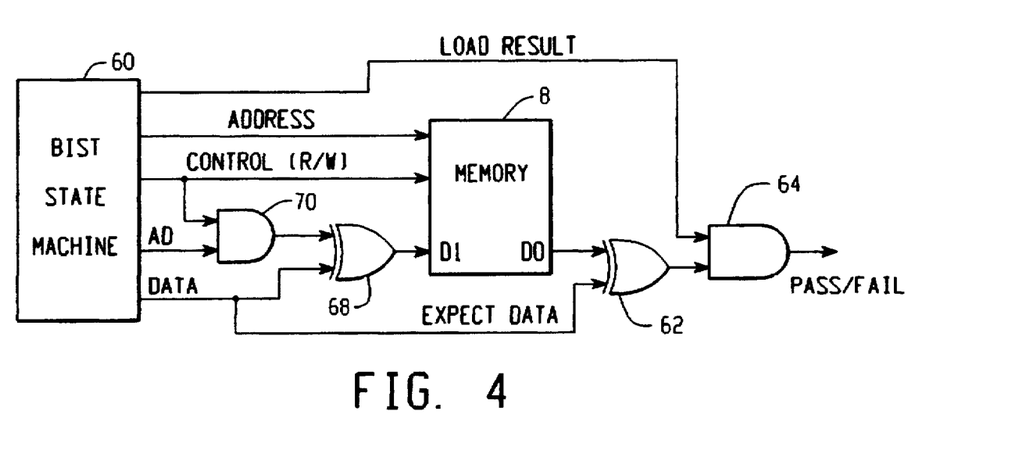
FIG. 4 is a test configuration for testing memories according to another embodiment of the present invention.

Another hardware implementation is shown in FIG. 4. In this implementation an AND gate 70 is interposed between the BIST state machine 60 and the XOR gate 68 which gate 70 has as one input an address descending (AD) input, as well as a control signal from the read/write control. This logic inverts the data at the DI port only during read cycles (R/W signal=1), when BIST is descending, the address space AD=1. If no fails are detected while ascending the address space (AD=0, DI=ED), but then fails are found when descending the address space (AD=1, DI≠ED) this would narrow the possible faults to the flush through variety (a stuck write control, stuck on write bit switch, switches or shorted write bit switches, etc.). This feature is useful in characterizing new hardware designs. If data at the DI port is not inverted during the read cycles (AD=0, DI=ED), fails detected could be from an inverted output, a bad wordline, or many other types of failure mechanisms. The fails would not be from a flush through fault; however, even if such a defect existed, since DI did equal ED during the test meaning that type of fail couldn't be detected.

In summary, various types of failures of memory can be detected by inverting the "data in" during certain read operations when a memory has been prewritten with the same data that is being generated by the BIST so that flushed through data can be detected when the test is not on a write cycle. Although an XOR gate is used in the preferred embodiment of FIG. 3 and an AND gate, XOR gate combination is used in the preferred embodiment of FIG. 4, it should be understood that other logic circuitry could be used to accomplish these functions.

Accordingly, the preferred embodiment of a built-in self-test for embedded memories on semiconduct substrates has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed:

1. A device for testing memory having separate write cycles and read cycles at a given port, comprising:

first logic circuitry to generate and input first write data of a known value to memory during a write cycle, second logic circuitry to generate and apply second write data to said memory during a read cycle which second write data is different from said first write data written to memory during said write cycle, and third logic circuitry to read data from memory during said read cycle.

2. The device of claim 1 including circuitry to provide expect data that is the same as said first data written to said memory during said write cycle.

3. The device of claim 2 including logic circuitry to compare said expect data to the data read from said memory.

4. The device of claim 2 wherein said first write data and said expect data are both either logic "1" or logic "0" and said expect data is the inverse of the second write data.

5. The device of claim 4 wherein said circuitry to generate said second write data during said read cycle that is different from said expect data includes an XOR gate.

6. The device of claim 5 wherein said XOR gate is connected to provide said second write data generated during the read cycle as the inverse of the expect data.

7. The device of claim 2 including logic circuitry to generate said expect data on said read cycle that is the same as the first write data generated on said write cycle.

8. The device of claim 2 wherein said device has a plurality of different read cycles, and said circuitry to provide said expect data provides expect data that is different from said second write data on prescribed read cycles.

9. The device of claim 8 wherein said read cycles include ascending address read cycles and descending address read cycles, and said logic circuitry to generate said second write data different from said expect data includes logic circuitry to generate said second write data only on one of said ascending and descending address read cycles.

10. A method of testing a memory using successive write and read cycles at a given point comprising the steps of:

writing first write data of a known value to said memory for storage therein during a write cycle, applying second write data to said memory during a subsequent read cycle which second write data is different from said first write data, and reading data from said memory during said read cycle.

11. A method of claim 10 wherein expect data is provided during said read cycle that matches said first write data written to said memory during said write cycle.

12. A method of claim 11 wherein said expect data is compared with said data read from the memory during said read cycle.

13. The method of claim 10 wherein said first write data and said expect data are both binary "1" or binary "0", and wherein said second write data is the inverse of said expect data.

14. The method of claim 10, wherein said second write data is provided only during read cycles.

15. The method of claim 10 wherein said expect data generated on a write cycle has the same value as said first write data generated on said write cycle.

16. The method of claim 10 wherein said device has a plurality of different read cycles, and wherein said second write data and expect data have the same value on at least one of said different cycles.

17. The method of claim 16 wherein said different read cycles include ascending address cycles and descending address cycles, and wherein said second write data and said expect data are different on only one of said ascending or descending address cycles.

* * * * *

UNITED STATES PATENT AND TRADEMARK OFFICE
CERTIFICATE OF CORRECTION

PATENT NO. : 5,784,323
DATED : July 21, 1998
INVENTOR(S) : Adams, et al.

It is certified that error appears in the above-indentified patent and that said Letters Patent is hereby corrected as shown below:

On title page, item [54], and col. 1, line 1,
In the title:

Please delete "CONVERAGE" and insert -- COVERAGE --.

Signed and Sealed this

First Day of December, 1998

Attest:

BRUCE LEHMAN

Attesting Officer

Commissioner of Patents and Trademarks